(12) United States Patent
Maly et al.

(10) Patent No.: US 6,906,404 B2
(45) Date of Patent: Jun. 14, 2005

(54) POWER MODULE WITH VOLTAGE OVERSHOOT LIMITING

(75) Inventors: Douglas K. Maly, Canton, MI (US); Sayeed Ahmed, Canton, MI (US); Ajay V. Patwardhan, Canton, MI (US); Fred Flett, Bloomfield, MI (US)

(73) Assignee: Ballard Power Systems Corporation, Dearborn, MI (US)

( * ) Notice: Subject to any disclaimer, the term of this patent is extended or adjusted under 35 U.S.C. 154(b) by 0 days.

(21) Appl. No.: 10/642,391

(22) Filed: Aug. 14, 2003

(65) Prior Publication Data

US 2004/0227231 A1 Nov. 18, 2004

Related U.S. Application Data

(60) Provisional application No. 60/471,387, filed on May 16, 2003.

(51) Int. Cl.[7] .............................................. H01L 23/02
(52) U.S. Cl. ..................... 257/678; 257/691; 257/723; 257/724; 438/15; 438/125
(58) Field of Search ................................. 257/678, 723, 257/691, 731, 724, 698; 438/15, 125

(56) References Cited

U.S. PATENT DOCUMENTS

| | | | |
|---|---|---|---|
| 4,142,231 A | 2/1979 | Wilson et al. | 363/141 |
| 4,224,663 A | 9/1980 | Maiese et al. | 363/144 |
| 4,458,305 A | 7/1984 | Buckle et al. | 363/141 |
| 4,661,897 A | 4/1987 | Pitel | 363/17 |
| 4,674,024 A | 6/1987 | Paice et al. | 363/71 |
| 5,172,310 A | 12/1992 | Deam et al. | 363/144 |
| 5,184,291 A | 2/1993 | Crowe et al. | 363/37 |
| 5,230,632 A | 7/1993 | Baumberger et al. | 439/66 |
| 5,243,757 A | 9/1993 | Grabbe et al. | 29/882 |
| 5,264,761 A | 11/1993 | Johnson | 315/291 |
| 5,395,252 A | 3/1995 | White | 439/66 |
| 5,422,440 A * | 6/1995 | Palma | 174/133 B |
| 5,439,398 A * | 8/1995 | Testa et al. | 439/801 |
| 5,445,526 A * | 8/1995 | Hoshino et al. | 439/69 |
| 5,459,356 A * | 10/1995 | Schulze et al. | 257/773 |
| 5,508,560 A * | 4/1996 | Koehler et al. | 257/730 |

(Continued)

FOREIGN PATENT DOCUMENTS

| | | |
|---|---|---|
| DE | 0 427 143 A2 | 5/1991 |
| DE | 195 19 538 A1 | 11/1996 |
| EP | 0 578 108 A1 | 1/1994 |
| JP | 9-117126 | 5/1997 |

OTHER PUBLICATIONS

U.S. Appl. No. 10/642,424, filed Aug. 14, 2003, Ahmed et al.
U.S. Appl. No. 60/233,992, filed Sep. 20, 2000, Ahmed et al.
U.S. Appl. No. 60/233,993, filed Sep. 20, 2000, Ahmed et al.
U.S. Appl. No. 60/233,994, filed Sep. 20, 2000, Ahmed et al.
U.S. Appl. No. 60/233,995, filed Sep. 20, 2000, Ahmed et al.
U.S. Appl. No. 60/233,996, filed Sep. 20, 2000, Ahmed et al.
U.S. Appl. No. 60/471,387, filed May 16, 2003, Ahmed et al.
Mohan et al., *Power Electronics: Converters, Applications and Designs*, John Wiley & Sons Inc., USA, 1989, Chapter 26–8, "Circuit Layout," p. 654.
Persson, E., "Power Electronic Design and Layout Techniques for Improved Performance and Reduced EMI," in *Proceedings of Power Electronics in Transporation, IEEE*, Dearborn, Michigan, Oct. 20–21, 1994, pp. 79–82.

Primary Examiner—Jasmine Clark
(74) Attorney, Agent, or Firm—Seed IP Law Group PLLC

(57) ABSTRACT

A power module employs at least one capacitor electrically coupled across the input terminals to reduce voltage overshoot. The capacitor may be surface mounted to a high side collector plating area and a low side emitter plating area. The power module may employ a lead frame and terminals accessible from an exterior of a module housing, for making electrical couplings to externally located power sources and/or loads.

18 Claims, 6 Drawing Sheets

U.S. PATENT DOCUMENTS

| | | | | |
|---|---|---|---|---|
| 5,537,074 A | * | 7/1996 | Iversen et al. | 327/564 |
| 5,559,374 A | * | 9/1996 | Ohta et al. | 257/723 |
| 5,635,751 A | * | 6/1997 | Ikeda et al. | 257/584 |
| 5,653,598 A | * | 8/1997 | Grabbe | 439/66 |
| 5,699,609 A | * | 12/1997 | Wieloch | 29/830 |
| 5,748,456 A | * | 5/1998 | Bayerer | 361/820 |
| 5,756,935 A | * | 5/1998 | Balanovsky et al. | 174/52.1 |
| 5,847,951 A | * | 12/1998 | Brown et al. | 363/147 |
| 5,938,451 A | * | 8/1999 | Rathburn | 439/66 |
| 5,975,914 A | * | 11/1999 | Uchida | 439/66 |
| 6,054,765 A | * | 4/2000 | Eytcheson | 257/724 |
| 6,072,707 A | * | 6/2000 | Hochgraf | 363/71 |
| 6,078,173 A | * | 6/2000 | Kumar et al. | 324/158.1 |
| 6,078,501 A | * | 6/2000 | Catrambone et al. | 361/704 |
| 6,166,937 A | | 12/2000 | Yamamura et al. | 363/141 |
| 6,176,707 B1 | | 1/2001 | Neidich et al. | 439/66 |
| 6,212,087 B1 | | 4/2001 | Grant et al. | 363/144 |
| 6,292,371 B1 | | 9/2001 | Toner, Jr. | 361/752 |
| 6,434,008 B1 | | 8/2002 | Yamada et al. | 361/728 |
| 6,603,672 B1 | | 8/2003 | Deng et al. | 363/37 |
| 2002/0034088 A1 | | 3/2002 | Parkhill et al. | 363/144 |
| 2002/0048161 A1 | * | 4/2002 | Malkowski et al. | 361/826 |
| 2002/0111050 A1 | | 8/2002 | Parkhill et al. | 439/65 |
| 2002/0118560 A1 | | 8/2002 | Ahmed et al. | 363/144 |
| 2002/0126465 A1 | | 9/2002 | Maly et al. | 361/818 |
| 2002/0167828 A1 | | 11/2002 | Parkhill et al. | 363/144 |

* cited by examiner

US 6,906,404 B2

POWER MODULE WITH VOLTAGE OVERSHOOT LIMITING

BACKGROUND OF THE INVENTION

1. Field of the Invention

This disclosure is generally related to electrical power systems, and more particularly to power module architectures suitable for rectifying, inverting and/or converting electrical power between power sources and loads.

2. Description of the Related Art

Power modules are typically self-contained units that transform and/or condition power from one or more power sources for supplying power to one or more loads. Power modules commonly referred to as "inverters" transform direct current (DC) to alternating current (AC), for use in supplying power to an AC load. Power modules commonly referred to as "rectifiers" transform AC to DC. Power modules commonly referred to as "DC/DC converters" step up or step down a DC voltage. An appropriately configured and operated power module may perform any one or more of these functions. The term "converter" is commonly applied generically to all power modules whether inverters, rectifiers and/or DC/DC converters.

Current flowing through various inductive paths within the module transiently stores energy which increases energy loss, reduces efficiency, and generates heat. When the flow of current changes, as in such a high frequency switching environment, large voltage overshoots often result, further decreasing efficiency. These large voltage overshoots typically reduce the power rating of the power module or require the use of circuitry devices with higher ratings than would otherwise be required, thus significantly increasing the cost of the power module.

To minimize the negative effects of current gradients, noise and voltage overshoots associated with the switching process of the module, large capacitors are generally placed in a parallel arrangement between the positive and negative DC connections or from each DC connection to a ground or chassis. These large capacitors are commonly referred to as "X" or "Y" capacitors. Relatively large external capacitors of about around 100 micro Farads are needed. By "external" it is meant that the element referred to is located outside of a power module. High frequency noise, and voltage overshoots that are initiated in the module by the switching process travel away from the source of the noise and voltage overshoots. A low impedance network may be used to provide a return path for the high frequency energy associated with noise and voltage overshoots. The further the energy travels, the more difficult it is to provide a low impedance network to return the energy. Therefore, capacitors attached between the positive and negative DC connections or from the DC connections to ground must be relatively large to minimize the impact of noise, and voltage overshoots. In addition, these external capacitors typically cause stray inductance, which renders the capacitor ineffective at frequencies higher than about 10 kHz.

These and other problems are avoided and numerous advantages are provided by the method and device described herein.

SUMMARY OF THE INVENTION

The disclosure is directed to an architecture for a power module that limits or dampens voltage overshoot, permitting the power module to handle larger loads, and/or allowing the use of circuitry with lower ratings than would otherwise be required and thus reducing cost.

In one aspect, a power module comprises: a lead frame forming at least a portion of a module housing; a first set of terminals accessible from an exterior of the lead frame; a second set of terminals accessible from the exterior of the lead frame; a positive DC bus received at least partially in the module housing; a negative DC bus received at least partially in the module housing; a number of high side switches received in the module housing and selectively electrically coupling a first one of the first set of terminals to respective ones of the second set of terminals; a number of low side switches received in the module housing and selectively electrically coupling a second one of the first set of terminals to respective ones of the second set of terminals; and at least one capacitor electrically coupled between the positive DC bus and the negative DC bus.

In another aspect, a power system comprises: a lead frame; a plurality of electrical terminals carried by the lead frame; a first bus bar coupled to the lead frame; a second bus bar coupled to the lead frame; a high side substrate coupled to the lead frame, the high side substrate comprising a number of electrically conductive high side collector areas and a number of electrically conductive high side emitter areas, the high side emitter areas electrically isolated from the high side collector areas; a low side substrate coupled to the lead frame, the low side substrate comprising a number of electrically conductive low side collector areas and a number of electrically conductive low side emitter areas, the low side emitter areas electrically isolated from the low side collector areas; a number of high side switches physically coupled to the high side substrate; a number of low side switches physically coupled to the low side substrate; and a number of capacitors, each of the capacitors electrically coupled between one of the high side collector areas and one of the low side emitter areas.

In a further aspect, method of forming a power module comprises: providing a lead frame; coupling a substrate comprising a high side and a low side to the lead frame, the high side comprising a number of high side collector areas and a number of high side emitter areas electrically isolated from the high side collector areas, the low side comprising a number of low side collector areas and a number of low side emitter areas electrically isolated from the high side collector areas; mounting a number of high side switches to the high side of the substrate; mounting a number of low side switches to the low side of the substrate; surface mounting at least one capacitor to a low side emitter area; and surface mounting the at least one capacitor to a high side collector area.

BRIEF DESCRIPTION OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn, are not intended to convey any information regarding the actual shape of the particular elements, and have been solely selected for ease of recognition in the drawings.

DETAILED DESCRIPTION OF THE INVENTION

In the following description, certain specific details are set forth in order to provide a thorough understanding of various embodiments of the invention. However, one skilled in the art will understand that the invention may be practiced without these details. In other instances, well-known structures associated with power modules, power semiconductors and controllers have not been shown or described in detail to avoid unnecessarily obscuring descriptions of the embodiments of the invention.

Unless the context requires otherwise, throughout the specification and claims which follow, the word "comprise" and variations thereof, such as, "comprises" and "comprising" are to be construed in an open, inclusive sense, that is as "including, but not limited to."

Figure 1:
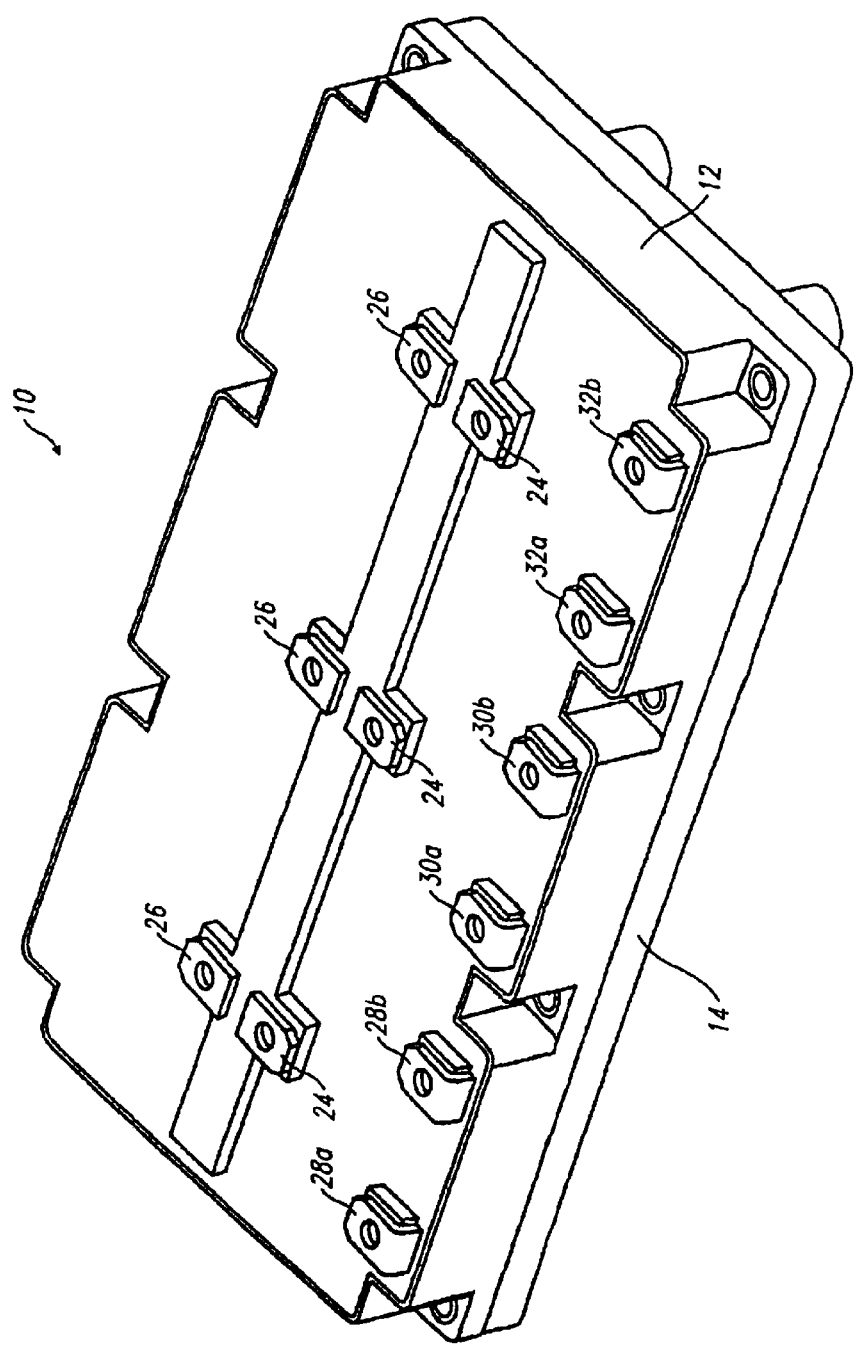
FIG. 1 is an isometric view of a power module comprising a housing, integrated cold plate, DC bus terminals, AC phase terminals, and power semiconductor devices.
Figure 2A:
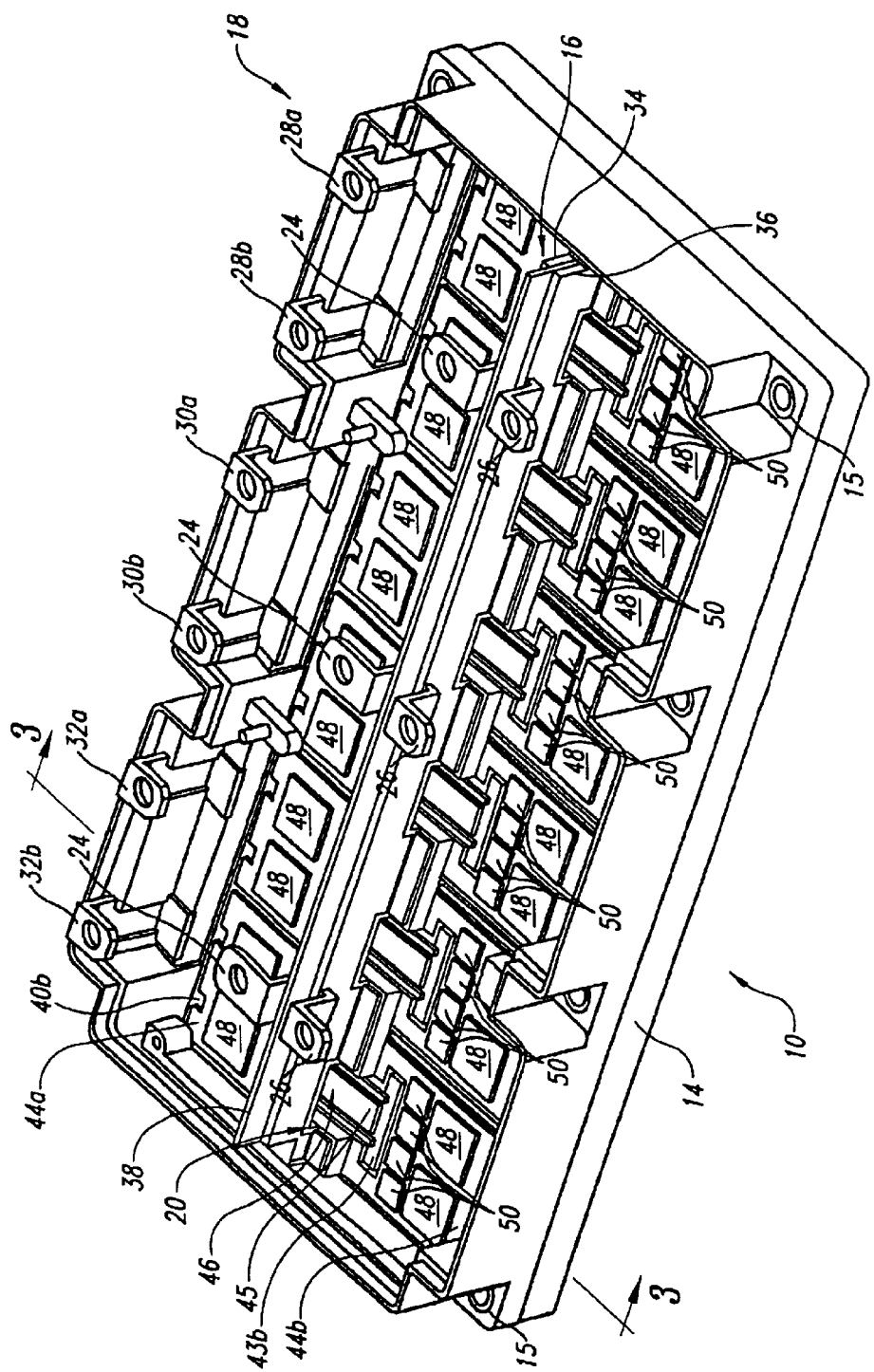
FIG. 2A is an isometric view of the power module of FIG. 1 with a cover removed and some portions broken or removed to show the DC bus, the AC bus, and the power semiconductor devices carried by various regions on a substrate.
Figure 2B:
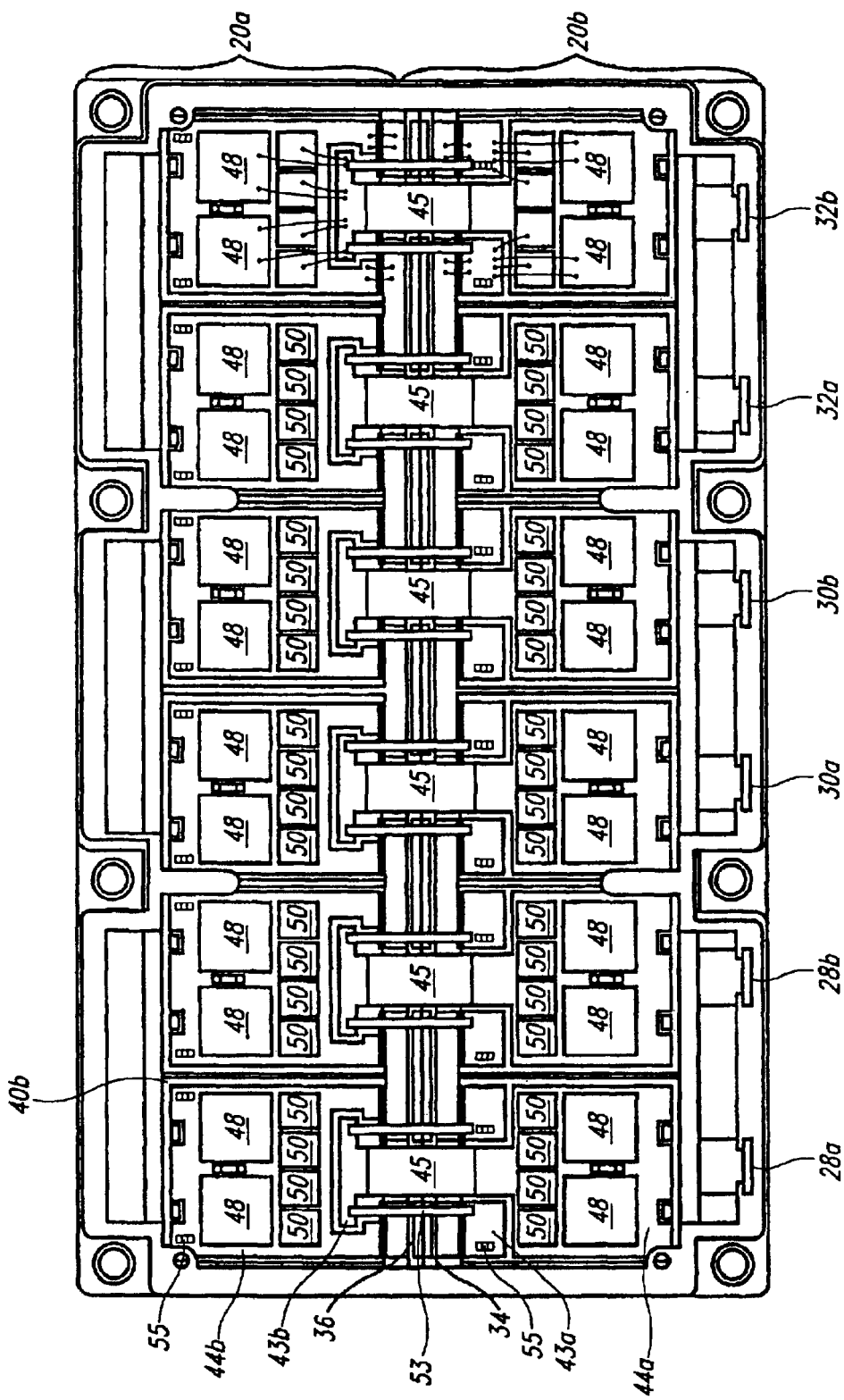
FIG. 2B is a top plan view of the power module of FIG. 2A showing a representative sampling of wire bonds electrically connecting various power semiconductor components, buses, and layers in the substrate as an inverter.

FIGS. 1, 2A, and 2B show a base power module 10, generally comprising: a lead frame or housing 12, an integrated cold plate 14 attached to the housing 12 via bushings 15, a DC bus 16, an AC bus 18; circuitry 20 electrically coupled between the DC bus 16 and AC bus 18, forming a high side 20a and a low side 20b of the power module 10. The base power module 10 may further include one or more gate drivers 22 for driving some of the power semiconductors 20.

Two sets of DC bus terminals 24, 26 extend out of the housing 12. In some applications one set of DC bus terminals 26 is electrically coupled to a positive voltage or high side of a power source or load and the other set of DC bus terminals is 24 is electrically coupled to a negative voltage or low side of the power source or load. In other applications, the DC bus terminals 24, 26 are electrically coupled to respective DC bus terminals 24, 26 on another power module. A set of AC phase terminals comprises three pairs of AC bus phase terminals 28a, 28b, 30a, 30b, 32a, 32b, extending out of the housing 12. In some applications, one pair of AC phase terminals coupled to a respective phase (A, B, C) of a three phase power source or load. In other applications, some of the AC phase terminals are interconnected across or between the pairs, and coupled to power sources or loads.

Figure 3:
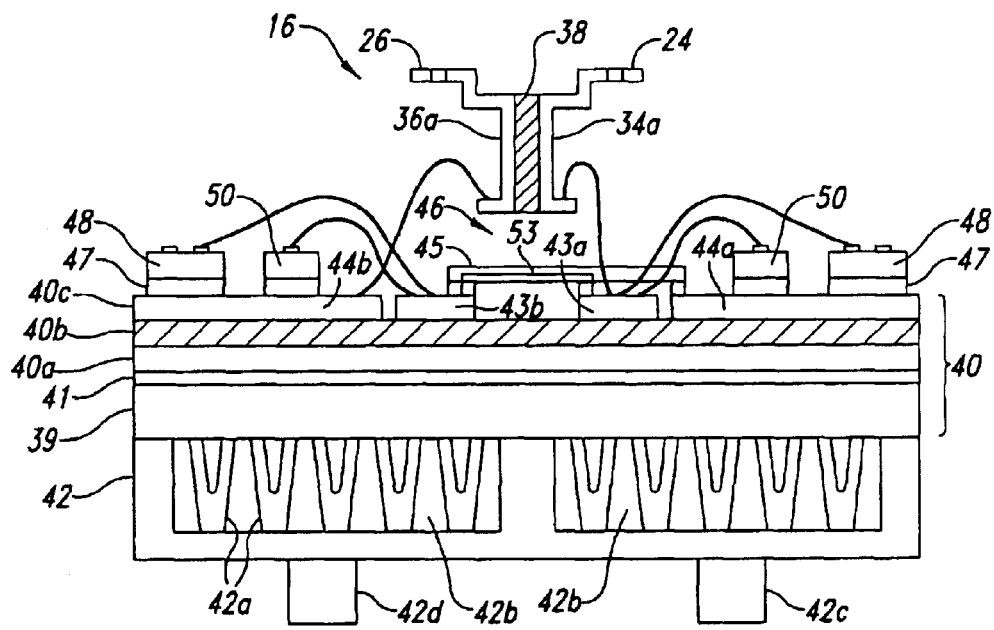
FIG. 3 is a schematic cross sectional view of one embodiment of the DC bus comprising a pair of L-shaped vertical DC bus bars spaced by an electrical insulation.

FIG. 3 shows a schematic cross-sectional view of the power module 10 taken along section line 3—3 of FIG. 2A. FIG. 3 is not an exact cross-sectional view, but has been modified to more accurately represent the electrical connections which would otherwise not be clearly represented in the FIG. 3.

The integrated cold plate 14 comprises a metal base plate 39, a direct copper bonded (DCB) substrate 40 which is attached to the metal base plate by a solder layer 41. A cooling header 42 including a number of cooling structures such as fins 42a, one or more fluid channels 42b, a fluid inlet 42c and a fluid outlet 42d for providing fluid connection flow to and from the fluid channels 42b, respectively.

The DCB substrate 40 typically comprise a first copper layer 40a, a ceramic layer 40b and a second copper layer 40c which are fused together. The second copper layer 40c may be etched or otherwise processed to form electrically isolated patterns or structures, as is commonly known in the art. For example, the second copper layer 40c may be etched to form regions of emitter plating 43a (i.e., emitter plating areas or emitter areas) and collector plating 44a (i.e., collector plating areas or collector areas) on a low side of the power module 10 (i.e., side connected to DC bus bar 34). Also for example, the second copper layer 40c may be etched to form regions of emitter plating 43b and collector plating 44b on the high side of the power module 10 (i.e., the side connected to DC bus bar 36).

A conductive strip 45 or wire bonds may extend between the collector plating 44a of the low side and the emitter plating 43b of the high side, passing through respective passages 46 formed under the DC bus bars 34, 36. As illustrated, the conductive strip 45 has be exaggerated in length on the low side of the power module 10 to better illustrate the electrical connection with the collector plating 44a.

Power semiconductor devices 20 are attached to the various structures formed in the second copper layer 40c via a solder 47. The power semiconductor devices 20 may include one or more switches for example, transistors 48 such as integrated bipolar gate transistors (IGBTs) or metal oxide semiconductor field effect transistors (MOSFETS). The power semiconductor devices 20 may also include one or more diodes 50. The power semiconductor devices 20 may have one or more terminals directly electrically coupled by the solder 47 to the structure on which the specific circuit element is attached. For example, the collectors of IGBTs 48 may be electrically coupled directly to the collector plating 44a, 44b by solder 47. Similarly, the cathodes of diodes 50 may be electrically coupled directly to the collector plating 44a, 44b by solder 47.

The DC bus 16 comprises a pair of L-shaped or vertical DC bus bars 34a, 36a. The upper legs of the L-shaped DC bus bars 34a, 36a are parallel and spaced from one another by the bus bar insulation 38. The lower legs of the L-shaped DC bus bars 34, 36 are parallel with respect to the substrate 40 to permit wire bonding to appropriate portions of the substrate. For example, the negative DC bus bar 34a may be wire bonded to the emitter plating 43a of the low side, while the positive DC bus bar 36a may be wire bonded to the collector plating 44b of the high side. The emitters of the IGBTs 48 and anodes of the diodes 50 may be wire bonded to the respective emitter plating 43a, 43b. Wire bonding in combination with the rigid structure of the DC bus 16 and housing 12 may also eliminate the need for a hard potting compound typically used to provide rigidity to protect solder interfaces. For low cost, the copper layers 40a and 40c may be nickel finished or aluminum clad, although gold or palladium may be employed at the risk of incurring higher manufacturing costs.

Figure 4:
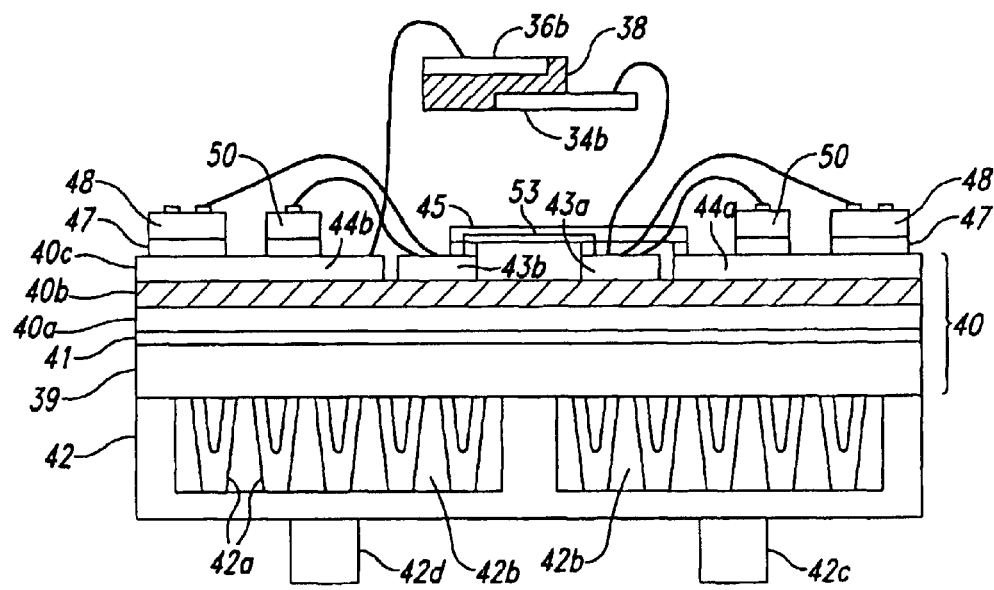
FIG. 4 is a schematic cross sectional view of one embodiment of the DC bus comprising a pair of generally planar DC bus bars spaced by an electrical insulation.

FIG. 4 shows another embodiment of the DC bus 16 for use in the power module 10, the DC bus 16 comprising a pair of generally planar DC bus bars 34b, 36b parallel and spaced from one another by a bus bar insulation 38. The DC bus bars 34b, 36b are horizontal with respect to a substrate 40 (FIGS. 1 and 2), with exposed portions to permit wire bonding to the various portions of the substrate 40.

Because the DC bus bars 34, 36 are parallel, counter flow of current is permitted, thereby canceling the magnetic fields and their associated inductances. In addition the parallel DC bus bars 34, 36 and bus bar insulation 38 construct a distributed capacitance. As will be understood by one of ordinary skill in the art, capacitance dampens voltage overshoots that are caused by the switching process. Thus, the DC bus bars 34, 36 of the embodiments of FIGS. 3 and 4 create a magnetic field cancellation as a result of the counter flow of current, and capacitance dampening as a result of also establishing a functional capacitance between them and the bus bar insulation 38.

Figure 5A:
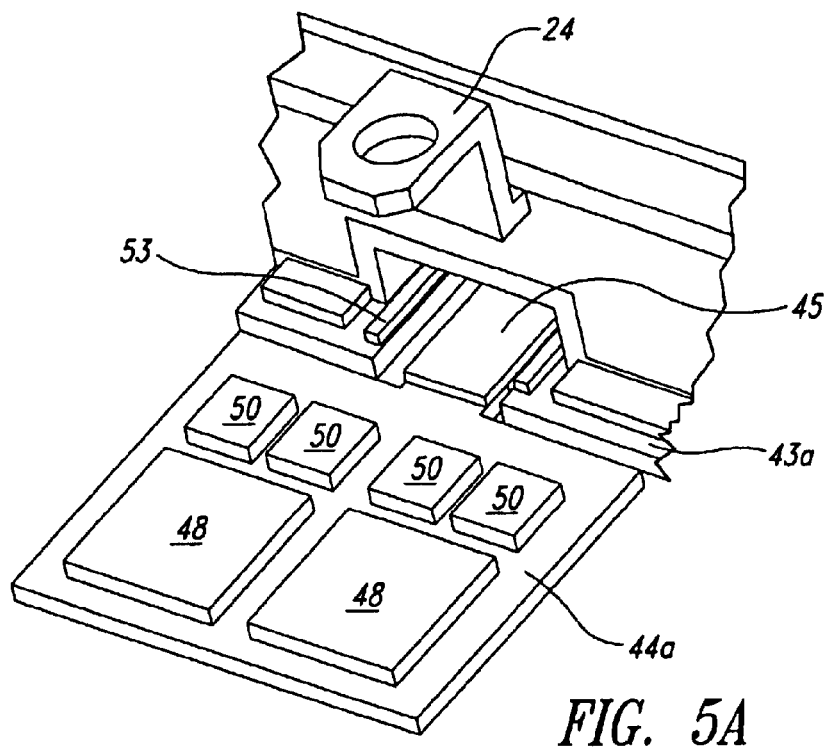
FIG. 5A is a partial isometric view of a portion of a low side of the power converter illustrating the surface mounting of snubber capacitors to a low side emitter area of the substrate.
Figure 5B:
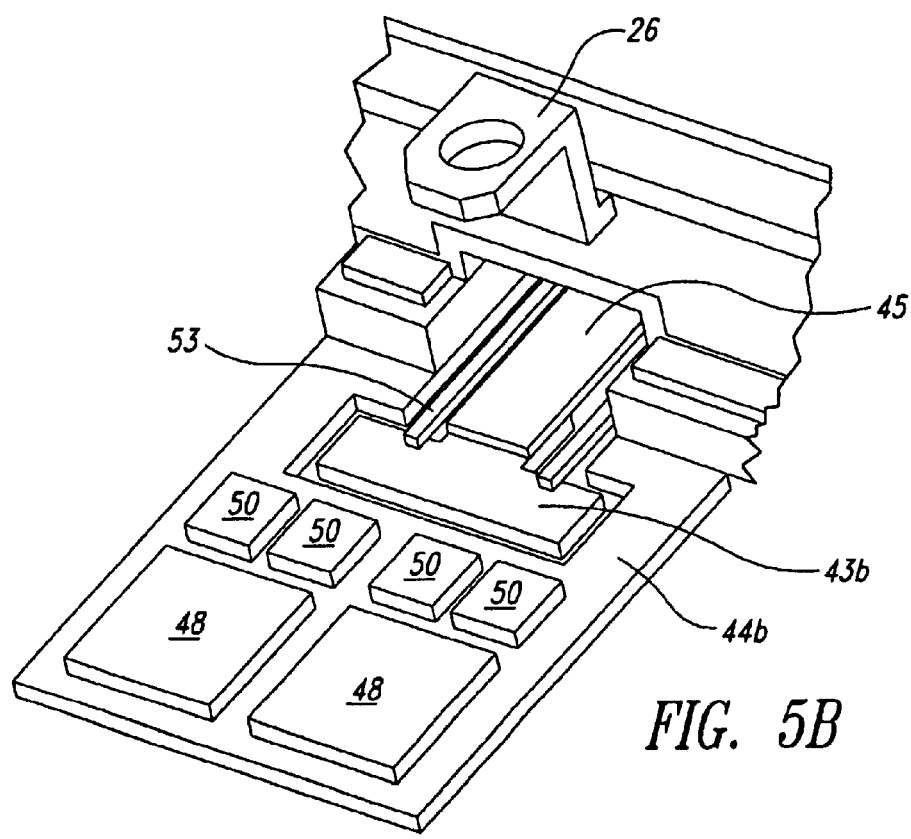
FIG. 5B is an isometric view of a portion of a high side of the substrate illustrating the surface mounting of the snubber capacitors of FIG. 5B to high side collector area of the substrate.
Figure 6:
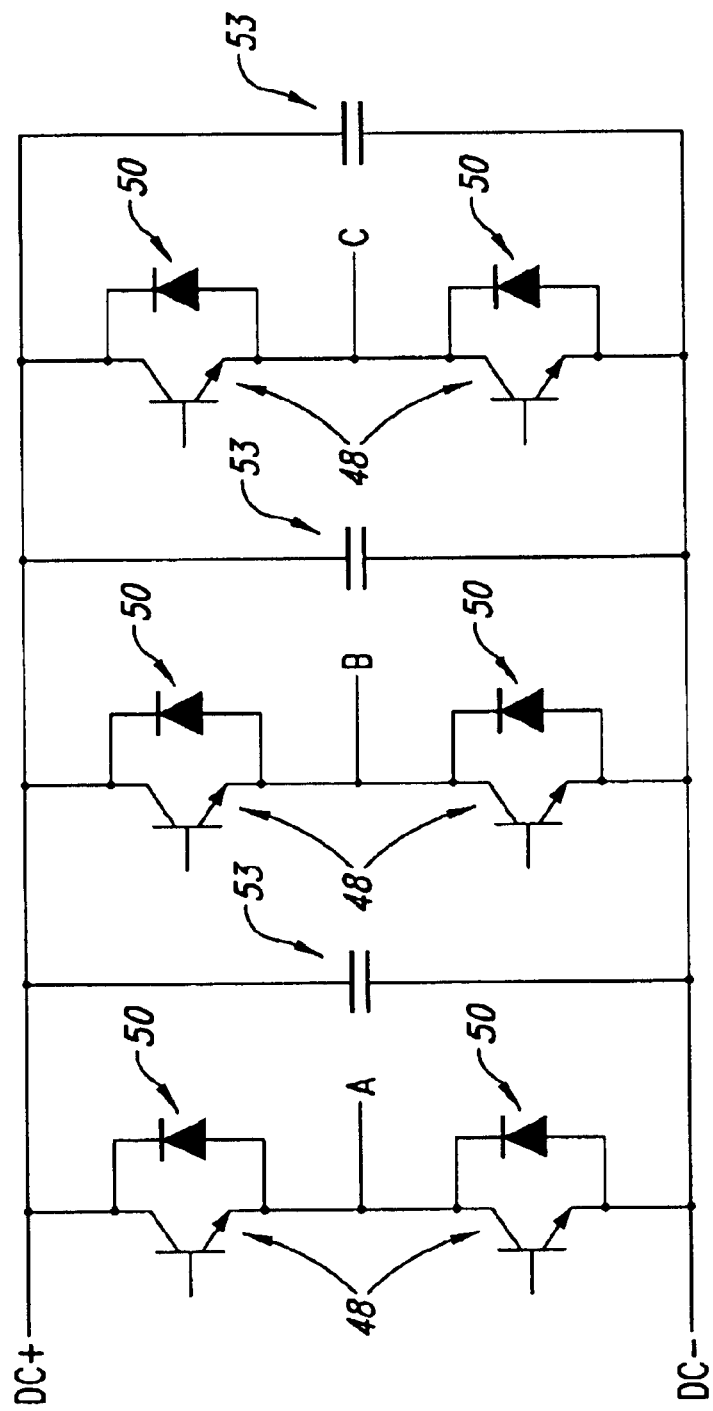
FIG. 6 is an electrical schematic of the switches, freewheeling diodes, and snubber capacitors according to an illustrated embodiment.

As best illustrated in FIGS. 5A, 5B and 6, the circuitry 20 includes a number of snubber capacitors 53 that are electrically coupled between the DC bus bars 34, 36 to clamp voltage overshoot. For example, some of the snubber capacitors 53 are electrically coupled directly (i.e., surface mounted) to the emitter plating 43a on the low side 20b of the power module 10 and are electrically coupled directly (i.e., surface mounted) to the collector plating 44b on the high side 20a of the power module 10. While the Figures show two snubber capacitors for each switching pair combination, the power module 10 may include fewer or a greater number of snubber capacitors as suits the particular application. Significant savings may be realized by effective clamping of voltage overshoot. For example, if switching is maintained below approximately 900V, a transformer may be eliminated. The snubber capacitors 53 can be soldered in the same operation as the soldering of the substrate 40 to the cold plate 14, or the soldering of other elements of the circuitry 20 to the substrate 40, simplifying manufacturing and reducing costs.

As best illustrated in FIGS. 2A and 2B, the circuitry 20 also includes a number of decoupling capacitors 55 which are electrically coupled between the DC bus bars 34 or 36 and ground to reduce EMI. In contrast to prior designs, the decoupling capacitors 55 are located on the substrate 40 inside the housing 12. For example, some of the decoupling capacitors 55 are electrically coupled directly to the emitter plating 43a on the low side 20b of the power module 10 and some of the decoupling capacitors 55 are electrically coupled directly to the collector plating 44b on the high side 20a of the power module 10. The decoupling capacitors 55 can be soldered in the same operation as the soldering of IGBTs 48 and 50 to the substrate 40.

As best illustrated in FIGS. 1 and 2A, the DC bus bars 34, 36 each include three terminals 24, 26, spaced along the longitudinal axis, to make electrical connections, for example, to a DC power source. Without being restricted to theory, Applicants believe that the spacing of the terminals 24, 26 along the DC bus bars 34, 36 provides lower inductance paths within the DC bus bars 34, 36 and to the external DC voltage storage bank.

In contrast to typical power modules, the DC bus bars 34, 36 are internal to the housing 12. This approach results in better utilization of the bus voltage, reducing inductance and consequently permitting higher bus voltages while maintaining the same margin between the bus voltage and the voltage rating of the various devices. The lower inductance reduces voltage overshoot, and problems associated with voltage overshoot such as device breakdown. The increase in bus voltage permits lower currents, hence the use of less costly devices. The bus bar insulation 38 between the DC bus bars 34, 36 may be integrally molded as part of the housing 12, to reduce cost and increase structural rigidity. The DC bus bars 34, 36 may be integrally molded in the housing 12, or alternatively, the DC bus bars 34, 36 and bus bar insulation 38 may be integrally formed as a single unit and attached to the housing 12 after molding, for example, via post assembly.

The power semiconductors 20 are directly mounted on the substrate 40 which is directly attached to the cold plate 14 via solder layer 41, the resulting structure serving as a base plate. The use of a cold plate 14 as the base plate, and the direct mounting of the power semiconductors 20 thereto, enhances the cooling for the power semiconductors 20 over other designs, producing a number of benefits such as prolonging the life of capacitors 55.

The power semiconductors 20 are operable to transform and/or condition electrical power. As discussed above, the power semiconductors 20 may include switches 48 and/or diodes 50. The power semiconductors 20 may also include other electrical and electronic components, for example, capacitors 55 and inductors, either discrete or formed by the physical layout. The power module 10 and power semiconductors 20 may be configured and operated as an inverter (DC→AC), rectifier (AC→DC), and/or converter (DC→DC; AC→AC). For example, the power module 10 and/or power semiconductors 20 may be configured as full three phase bridges, half bridges, and/or H-bridges, as suits the particular application.

In at least one described embodiment, the power module 10 comprises three half bridges combined into a single three-phase switching module, or single half bridge modules that may be linked together to form a three phase inverter. As would be understood by one of ordinary skill in the art, the same DC to AC conversion may be accomplished with using any number of half bridges, which correspond to a phase, and each switching pair may contain any number of switching devices. For simplicity and clarity, many of the examples herein use a common three phase/three switching pair configuration, although this should not be considered limiting.

In at least one described embodiment, current flows from the power source through the positive DC bus bar 36 to the collector plating 44b on the high side of the power module 10. Current is then permitted to flow through one or more of the switching devices 48 and/or diodes 50 on the high side to the emitter layer 43b. The current passes to the collector layer 44a on the low side via the conductive strip 45 passing under the DC bus bars 34, 36. A phase terminal allows current to flow from the collector layer 44a on the low side to a load such as a three phase AC motor. Similarly, the negative DC bus bar 34 couples the load to the switching devices 48 and/or diodes 50 on the low side via the emitter layer 43a.

The overall design of the standard power module 10, including the position and structure of the DC and AC buses 16, 18, topology and modularity of substrates 40 and the inclusion of six phase terminals 28a, 28b, 30a, 30b, 32a, 32b in the AC bus 16 provides great flexibility, allowing the standard power module 10 to be customized to a variety of applications with only minor changes and thus relatively small associated costs. A number of these applications are discussed below.

Although specific embodiments of and examples for the power module and method of the invention are described herein for illustrative purposes, various equivalent modifications can be made without departing from the spirit and scope of the invention, as will be recognized by those skilled in the relevant art. The teachings provided herein of the invention can be applied to power module and power converters, rectifiers and/or inverters not necessarily the exemplary power module and systems generally described above.

While elements may be describe herein and in the claims as "positive" or "negative" such denomination is relative and not absolute. Thus, an element described as "positive" is shaped, positioned and/or electrically coupled to be at a higher relative potential than elements described as "negative" when the power module 10 is coupled to a power source. "Positive" elements are typically intended to be coupled to a positive terminal of a power source, while "negative" elements are intended to be coupled to a negative terminal or ground of the power source. Generally, "positive" elements are located or coupled to the high side of the power module 10 and "negative" elements are located or coupled to the low side of the power module 10.

The power modules described above may employ various methods and regimes for operating the power modules 10 and for operating the switches (e.g., IGBTs 48). The particular method or regime may be based on the particular application and/or configuration. Basic methods and regimes will be apparent to one skilled in the art, and do not form the basis of the inventions described herein so will not be discussed in detail for the sake of brevity and clarity.

The various embodiments described above can be combined to provide further embodiments. All of the above U.S. patents, patent applications and publications referred to in this specification, including but not limited to: Ser. Nos. 60/233,992; 60/233,993; 60/233,994; 60/233,995 and 60/233,996 each filed Sep. 20, 2000; Ser. No. 09/710,145 filed Nov. 10, 2000; Ser. Nos. 09/882,708 and 09/957,047 both filed Jun. 15, 2001; Ser. Nos. 09/957,568 and 09/957,001 both filed Sep. 20, 2001; Ser. No. 10/109,555 filed Mar. 27, 2002; and Ser. No. 60/471,387 filed May 16, 2003, are incorporated herein by reference, in their entirety, as are the sections which follow this description. Aspects of the invention can be modified, if necessary, to employ systems, circuits and concepts of the various patents, applications and publications to provide yet further embodiments of the invention.

These and other changes can be made to the invention in light of the above-detailed description. In general, in the following claims, the terms used should not be construed to limit the invention to the specific embodiments disclosed in the specification and the claims, but should be construed to include all power modules, rectifiers, inverters and/or converters that operate or embody the limitations of the claims. Accordingly, the invention is not limited by the disclosure, but instead its scope is to be determined entirely by the following claims.

What is claimed is:

1. A power module for supplying power to loads from power sources, the power module comprising:
   a lead frame forming at least a portion of a module housing;
   a first set of terminals accessible from an exterior of the lead frame;
   a second set of terminals accessible from the exterior of the lead frame;
   a positive DC bus received at least partially in the module housing;
   a negative DC bus received at least partially in the module housing;
   a number of high side switches received in the module housing and selectively electrically coupling a first one of the first set of terminals to respective ones of the second set of terminals;
   a number of low side switches received in the module housing and selectively electrically coupling a second one of the first set of terminals to respective ones of the second set of terminals; and
   at least one capacitor received in the lead frame and electrically coupled between the positive DC bus and the negative DC bus.

2. The power module of claim 1, further comprising:
   at least one substrate coupled to the lead frame, the at least one substrate comprising a high side and a low side;
   a number of high side collector plating areas formed on the high side of the at least one substrate; and
   a number of low side emitter plating areas formed on the low side of the at least one substrate, where the at least one capacitor is surface mounted to at least one of the high side collector plating areas and the low side emitter plating areas.

3. The power module of claim 1, further comprising:
   at least one substrate coupled to the lead frame, the at least one substrate comprising a high side and a low side;
   a number of high side collector plating areas formed on the high side of the at least one substrate; and
   a number of low side emitter plating areas formed on the low side of the at least one substrate, where a first pole of the at least one capacitor is surface mounted to one of the high side collector plating areas and where a second pole of the at least one capacitor is surface mounted to one of the low side emitter plating areas.

4. The power module of claim 1, further comprising:
   at least one substrate coupled to the lead frame, the at least one substrate comprising a high side and a low side;
   a number of high side collector plating areas formed on the high side of the at least one substrate; and
   a number of low side emitter plating areas formed on the low side of the at least one substrate, where for each of the number of high side collector plating areas at least one capacitor is surface mounted to one of the high side collector plating areas and is surface mounted to a respective one of the low side emitter plating areas.

5. The power module of claim 1 wherein the positive DC bus comprises a positive DC bus bar and the negative DC bus comprises a negative DC bus bar, the negative DC bus bar comprising at least a portion parallel to and spaced from a portion of the positive DC bus bar by a dielectric material.

6. The power module of claim 5, further comprising:
   at least one substrate coupled to the lead frame, the at least one substrate comprising a high side and a low side;
   a number of high side collector plating areas formed on the high side of the at least one substrate; and
   a number of low side emitter plating areas formed on the low side of the at least one substrate, where for each of the number of high side collector plating areas at least one capacitor is surface mounted to one of the high side collector plating areas and is surface mounted to a respective one of the low side emitter plating areas, each of the capacitors passing through at least one of a number of passages formed in the positive and the negative DC bus bars.

7. A power module, comprising:
   a lead frame;
   a plurality of electrical terminals carried by the lead frame;
   a first bus bar coupled to the lead frame;
   a second bus bar coupled to the lead frame;
   a high side substrate coupled to the lead frame, the high side substrate comprising a number of electrically conductive high side collector areas and a number of electrically conductive high side emitter areas, the high side emitter areas electrically isolated from the high side collector areas;
   a low side substrate coupled to the lead frame, the low side substrate comprising a number of electrically conductive low side collector areas and a number of electrically conductive low side emitter areas, the low side emitter areas electrically isolated from the low side collector areas;
   a number of high side switches physically coupled to the high side substrate;
   a number of low side switches physically coupled to the low side substrate; and
   a number of capacitors received in the lead frame, each of the capacitors electrically coupled between one of the high side collector areas and one of the low side emitter areas.

8. The power module of claim 7 wherein each of the capacitors is surface mounted to the respective high side collector area.

9. The power module of claim 7 wherein each of the capacitors is surface mounted to the respective low side emitter area.

10. The power module of claim 7 wherein each of the capacitors is surface mounted to the respective high side collector area and is surface mounted to the respective low side emitter area.

11. The power module of claim 7 wherein at least a portion of the first bus bar and at least a portion of the second bus bar are parallel to one another, and spaced from one another by a dielectric material.

12. The power module of claim 7 wherein the first and the second bus bars comprise a number of passages and the capacitors extend through the passages between the high side substrate and the low side substrate.

13. A method of forming a power module, the method comprising:
   providing a lead frame;
   coupling a substrate comprising a high side and a low side to the lead frame, the high side comprising a number of high side collector areas and a number of high side emitter areas electrically isolated from the high side collector areas, the low side comprising a number of low side collector areas and a number of low side emitter areas electrically isolated from the low side collector areas;
   mounting a number of high side switches to the high side of the substrate;
   mounting a number of low side switches to the low side of the substrate;
   surface mounting at least one capacitor to one of the low side emitter areas; and
   surface mounting the at least one capacitor to one of the high side collector areas.

14. The method of claim 13, further comprising:
   for each of the high side switches, surface mounting a collector of the high side switch to one of the high side collector areas; and
   for each of the low side switches, surface mounting a collector of the low side switch to one of the low side collector areas.

15. The method of claim 14, further comprising:
   for each of the high side switches, wire bonding an emitter of the high side switch to one of the high side emitter areas; and
   for each of the low side switches, wire bonding an emitter of the low side switch to one of the low side emitter areas.

16. The method of claim 14, further comprising:
   electrically coupling each of the high side emitter areas to a respective one of the low side collector areas.

17. The method of claim 14, further comprising:
   providing a first bus structure;
   providing a second bus structure;
   electrically coupling each of the high side emitter areas to a respective one of the low side collector areas through a number of passages formed in the first and the second bus structures.

18. The method of claim 14, further comprising:
   providing a first bus structure;
   providing a second bus structure;
   providing a number of conductive straps electrically coupling each of the high side emitter areas to a respective one of the low side collector areas through a number of passages formed in the first and the second bus structures.

* * * * *